Figure 1:
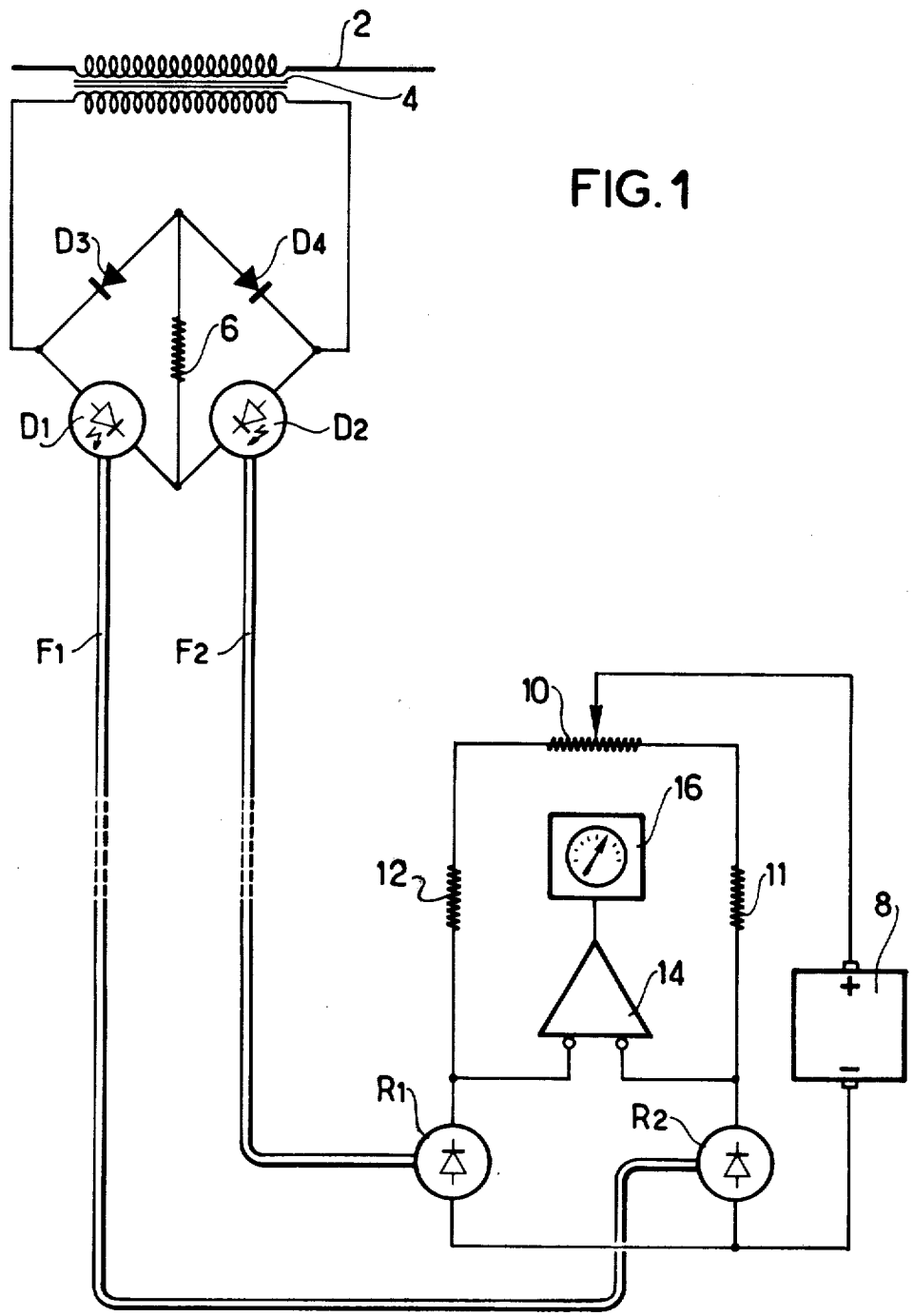

United States Patent [19]

Boirat et al.

[11] 4,054,834
[45] Oct. 18, 1977

[54] DEVICE FOR MEASURING AC IN A HIGH TENSION LINE

[75] Inventors: Robert Boirat, Chilly-Mazarin; Claude Davila, Paris; Christian Moreau, Marcoussis, all of France

[73] Assignee: Compagnie Generale d'Electricite S.A., Paris, France

[21] Appl. No.: 756,526

[22] Filed: Jan. 3, 1977

[30] Foreign Application Priority Data

Jan. 14, 1976 France ............................ 76.00841
Mar. 31, 1976 France ............................ 76.0935

[51] Int. Cl.² .......................................... G01R 31/00
[52] U.S. Cl. ............................ 324/96; 324/123 R; 324/123 C; 324/127; 250/209
[58] Field of Search ............ 324/96, 101, 119, 123 R, 324/123 C, 126, 127, 97, 133; 250/552, 210, 209

[56] References Cited

U.S. PATENT DOCUMENTS

| | | | |
|---|---|---|---|
| 2,829,343 | 4/1958 | Miller | 324/119 |
| 2,948,853 | 8/1960 | Nylander | 324/127 |
| 3,340,427 | 9/1967 | Bisso | 250/210 |
| 3,346,811 | 10/1967 | Perry et al. | 324/127 |
| 3,430,054 | 2/1969 | Klein | 250/552 |
| 3,718,822 | 2/1973 | Pascoe | 250/210 |
| 3,860,868 | 1/1975 | Lindell et al. | 324/119 |
| 3,943,367 | 3/1976 | Baker | 324/96 |

FOREIGN PATENT DOCUMENTS

2,333,907  1/1975  Germany ............................ 324/96

Primary Examiner—John Kominski
Attorney, Agent, or Firm—Sughrue, Rothwell, Mion, Zinn and Macpeak

[57] ABSTRACT

Shunt means supply a diode bridge with an alternating current proportional to the AC to be measured. The bridge has at least two electroluminescent diodes which emit two alternating streams of half-wave light pulses which are supplied to two fibre optic systems. These convey the light signals to a safe distance from the high tension line where two light receptors receive the respective streams of half-wave light pulses and apply electrical signals proportional thereto to opposite inputs of a differential amplifier. The output of the amplifier is a readily measurable AC. Balancing means may be provided to compensate for any difference in the overall transmission paths for the two half-wave pulse streams. A resistive load may be provided adjacent the line to sink the current flowing through the diode bridge.

6 Claims, 2 Drawing Figures

4,054,834

DEVICE FOR MEASURING AC IN A HIGH TENSION LINE

The present invention relates to a device for measuring the alternating current flowing in a high tension line.

It is known that when a measurement is to be made of the current flowing in an electric line at a high tension, such as 250 kV for example, difficulties present themselves because of the high tension which exists between the line and the observer. This has lead to proposals for measuring devices including a measuring unit, such as a Faraday cell, situated near the line. The measuring unit provides or modulates a light signal which is received by a receiver unit situated at a distance from the line and near to the observer. Such a device removes any risk of an electric discharge between the line and the observer, in spite of the high tension.

Such devices, nevertheless have the drawback of being relatively complex, expensive, sensitive to atmospheric conditions and requiring delicate adjustment, and sometimes needing an electricity supply near to the high tension line.

It has also been proposed, in Siemens' Swiss Pat. No. 532,791, to measure an alternating current flowing in a high tension line by means of an electro-optical or magneto-optical modulator capable of producing optical interference and with a power supply derived from two diodes, one for each direction of current flow. Light pulses produced by the interference are transmitted over a distance away from the line by optical fibres. Such a device is also complex and expensive.

Preferred embodiments of the present invention provide a device for measuring the alternating current flowing in a high tension line without risk of an electric discharge, of simple construction and insensitive to atmospheric conditions.

The present invention provides a device for measuring alternating current flowing in a high tension line, the device comprising two fibre optic systems for conveying two light signals representative of the current flowing in the line to a point distant from the line;

shunt means adjacent the line for providing an electric signal substantially proportional to the current flowing in the line, the direction of the electric signal corresponding to the direction of the said current;

diode bridge means adjacent the line comprising at least two diodes fed by the said electric signal and so connected that one or other of the diodes is conductive according to the direction of the electric signal, each of the two diodes being electroluminescent and being arranged to supply a light flux when conductive representative of the value of the electric signal;

the two said fibre optic systems receiving respective light fluxes from the two said electroluminescent diodes and conveying the fluxes to a point distant from the line;

two light receptors at a distance from the line receiving the fluxes conveyed by the two said fibre optic systems such that each receptor, on receiving light, supplies a half-wave signal representative of the light flux;

a differential circuit at a distance from the line receiving the two said half-wave signals and supplying an output signal of one polarity or the other according to whether it is receiving the half-wave signal from one or the other of the two said receptors, the amplitude of the output signal being representative of the amplitude of these half-wave signals; and a measuring unit receiving the said output signal.

Figure 2:
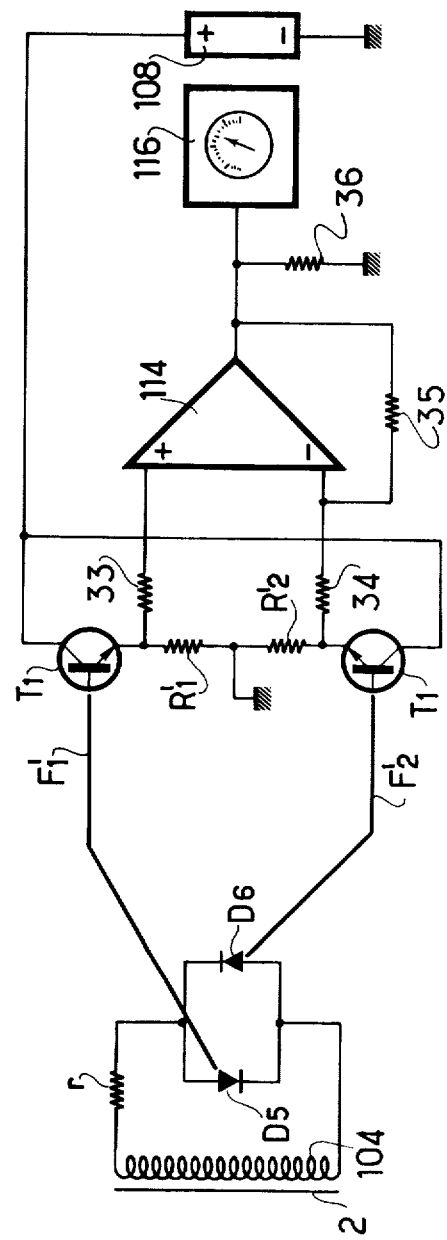

Two embodiments of the invention are described by way of example with reference to the accompanying drawings in which FIGS. 1 and 2 are circuit diagrams of first and second embodiments of the device.

The device is intended for measuring the intensity of the current flowing along a high tension line 2, but it could also be used for measuring other characteristics of the current such as its frequency for example.

The first embodiment of the device comprises a transformer 4 whose primary winding has the current to be measured flowing through it (or a porportional current) and whose secondary winding feeds the diagonal of a four diode bridge (D1, D2, D3 and D4) connected to feed unidirectional current to a resistor 6 connected across the other diagonal.

The diodes D1 and D2 are connected in such a way as to conduct during alternate half cycles of the current. They are electroluminescent and supply a light flux proportional to the current flowing through them. The light supplied by these two diodes D1 and D2 is applied to the inputs of respective optical fibres F1 and F2. The fibres are of great length and convey the light to two light receptors R1 and R2 situated a long way from the line 2. These receptors are constituted by two photo diodes reverse biased by a single DC source 8 via a variable balance resistor 10 and two load resistors 11 and 12. The signals supplied by these receptors are applied to two inputs of a differential amplifier 14 whose output signal is applied to a measuring unit 16 for AC.

The variable differential arrangement thus constituted allows for the compensation of any possible differences between the currents flowing through the diodes D1 and D2, the light flux received by the receptors R1 and R2, and the sensitivities of the receptors R1 and R2.

The second embodiment of the device comprises a transformer 104 whose primary winding has the current to be measured flowing through it (or a proportional current) and whose secondary winding feeds two diodes D5 and D6 connected head to tail in series with a current limiting resistor $r$.

The diodes D5 and D6 are connected in such a way as to conduct during alternate half cycles of the current. They are electroluminescent and supply a light flux proportional to the current flowing through them. The light supplied by these two diodes D5 and D6 is applied to the inputs of respective optical fibres F1 and F2. The fibres are of great length and convey the light to two light receptors T1 and T2 situated a long way from the line 2. These receptors are constituted by two photo transistors connected to be fed from a single direct current source 108 via respective load resistors $R'1$ and $R'2$ in their emitter circuits. The signals at the emitters of the transistors T1 and T2 are alternately zero when there is no light signal applied to the base of the transistor, and proportional to the AC being measured when a light signal is applied to the base. These signals are applied via resistors 33 and 34 to two inputs of a high gain differential amplifier 14 (i.e. an operational amplifier) whose output signal is applied to its negative input via a feed back resistor 35.

The output is also connected to the negative terminal of the DC source 108 (earth) via an output resistor 36. The resistances of the resistors $r$, $R'1$, $R'2$, 33, 34, 35 and 36 are so chosen that the output signal of the amplifier 114 accurately reproduces in alternate half-cycles the light flux conveyed by the respective optical fibres F'1 and F'2.

Let this output voltage be V and assume that the current I flowing through the diodes D5 and D6 is large enough to ensure that the light flux emitted by these diodes varies proportionally to the current; then $$I = BV + $$

where B and C are constants depending on the components used. The output voltage V is measured by an AC measuring instrument 116.

What we claim is:

1. A device for measuring alternating current flowing in a high tension line, comprising two fibre optic systems for conveying two light signals representative of the current flowing in the line to a point distant from the line;

shunt means adjacent the line for providing an electric signal substantially proportional to the current flowing in the line, the direction of the electric signal corresponding to the direction of the said current;

diode bridge means adjacent the line comprising at least two diodes fed by the said electric signal and so connected that one or other of the diodes is conductive according to the direction of the electric signal, each of the two diodes being electroluminescent and being arranged to supply a light flux when conductive representative of the value of the electric signal;

the two said fibre optic systems receiving respective light fluxes from the two said electroluminescent diodes and conveying the fluxes to a point distant from the line;

two light receptors at a distance from the line receiving the fluxes conveyed by the two said fibre optic systems such that each receptor, on receiving light, supplies a half-wave signal representative of the light flux;

a differential circuit at a distance from the line receiving the two said half-wave signals and supplying an output signal of one polarity or the other according to whether it is receiving the half-wave signal from one or the other of the two said receptors, the amplitude of the output signal being representative of the amplitude of these half-wave signals; and a measuring unit receiving the said output signal.

2. A device according to claim 1, wherein the said two receptors and the differential circuit are provided with balancing means for compensating possible differences between the said electroluminescent diodes, the fibre optic systems and/or the receptors.

3. A device according to claim 1, wherein the said diode bridge comprises four diodes and is fed across one diagonal from the said shunt means and feeds a resistance across the other diagonal with unidirectional current.

4. A device according to claim 1, wherein the said diode bridge comprises two diodes mounted head to tail and fed from the said shunt means via a current limiting resistance.

5. A device according to claim 1, wherein the receptors are constituted by photodiodes.

6. A device according to claim 1, wherein the receptors are constituted by phototransistors.

* * * * *